(12) United States Patent
Lohse et al.

(10) Patent No.: US 6,581,026 B2
(45) Date of Patent: Jun. 17, 2003

(54) METHOD AND CONFIGURATION FOR COMPARING A FIRST CHARACTERISTIC WITH PREDETERMINED CHARACTERISTICS OF A TECHNICAL SYSTEM

(75) Inventors: Joerg Lohse, Munich (DE); Peter Warkentin, Oberhaching (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/848,584

(22) Filed: May 3, 2001

(65) Prior Publication Data

US 2002/0013680 A1 Jan. 31, 2002

Related U.S. Application Data

(63) Continuation of application No. PCT/DE99/03486, filed on Nov. 2, 1999.

(30) Foreign Application Priority Data

Nov. 3, 1998 (DE) .......................................... 198 50 669

(51) Int. Cl.[7] .............................................. G06F 15/00
(52) U.S. Cl. ...................... 702/189; 702/85; 702/117; 702/189; 703/2; 703/13; 703/26; 712/221; 712/300; 716/4; 716/5; 716/18
(58) Field of Search ................................ 702/189, 127, 702/32, 122; 716/1, 4, 12, 18; 703/14, 17, 5, 7, 1, 2

(56) References Cited

U.S. PATENT DOCUMENTS

| | | | |
|---|---|---|---|
| 5,754,454 A | | 5/1998 | Pixley et al. |
| 6,086,626 A | * | 7/2000 | Jain et al. ..................... 716/5 |
| 6,308,299 B1 | * | 10/2001 | Burch et al. .................. 716/4 |

FOREIGN PATENT DOCUMENTS

EP 0878769 A2 11/1998

OTHER PUBLICATIONS

Andreas Kuehlmann et al.: "Equivalence Chicking Using Cuts and Heaps", 34th ACM/IEEE Design Automation Conference, 1997, pp. 263–268.
J. Jain et al.: "A Survey of Techniques for Formal Verification of Combinational Circuits", Proc. Int. Conf. On Computer Design (ICCD), 1997, pp. 445–454.
J.P.M. Silva: "An Overview of Backtrack search Satisfiability Algorithms", 5th. Int. Symposium on Artificial Intelligence and Mathematics, 1998.
R.J. Bayardo Jr. et al.: "Using CSP Look–Back Techniques to Solve Real–World SAT–Instances", Proc. Of the National Conf. On Artificial Intelligence, pp. 203–208, Jul. 1997.
Y. Matsunaga: "An Efficient Equivalence Checker for Combination Circuits", 33rd ACM/IEEE Design Automation Conference, 1996, pp. 629–634.
M. Davis et al.: "A Computing Procedure for Quantification Theory", Journal of the Association for Computing Machinery, vol. 7, No. 3, Jul. 1960, pp. 125–139.
Aarti Gupta et al.: "Integrating a Boolean Satisfiability Checker and BDDs for Combinational Equivalence Checking" 11th International Conference on VLSI Design, 1998, pp. 222–225.
Florian Krohm et al.: "The Use of Random Simulation in Formal Verification", Proceedings of the International Conference on Computer Design ICCD. VLSI, IEEE Comp. Soc. Press, 1996, pp. 371–376.
Gabriel Bischoff et al.: "Formal Implementation Verification of the Bus Interface Unit for the Alpha 21264 Microprocessor", Proceedings of the International Conference on Computer Design, VLSI, IEEE, 1997, pp. 16–24.

* cited by examiner

Primary Examiner—Marc S. Hoff
Assistant Examiner—Elias Desta
(74) Attorney, Agent, or Firm—Laurence A. Greenberg; Werner H. Stemer; Ralph E. Locher (57) ABSTRACT

The objective of the invention is to detect a characteristic in a technical system with reference to model checking. A comparison is made, involving the coordination of several comparative processes, whereby the comparison leads to a result. The comparison is terminated as soon as a comparative process proves that the characteristic is present or not in the appropriate system.

35 Claims, 6 Drawing Sheets

METHOD AND CONFIGURATION FOR COMPARING A FIRST CHARACTERISTIC WITH PREDETERMINED CHARACTERISTICS OF A TECHNICAL SYSTEM

CROSS-REFERENCE TO RELATED APPLICATION

This application is a continuation of copending International Application No. PCT/DE99/03486, filed Nov. 2, 1999, which designated the United States.

BACKGROUND OF THE INVENTION

Field of the Invention

The invention relates to a method and a configuration for comparison of a first characteristic with predetermined characteristics of a technical system.

Model checking (MC) is a technique for verifying characteristics of a technical system using specific methods. In the past, a major complexity problem (state explosion problem) has occasionally arisen when this procedure was applied to the technical system. As a result of this, considerable efforts are being made to separate out a portion of a system that is to be verified, which is relevant for analysis and can be verified practically. Even then, the verification process often fails due to existing resource limits (computation performance, memory space).

As described by Kühlmann and Krohm, in "Equivalence Checking Using Cuts and Heaps", 34th ACM/IEEE Design Automation Conference, 1997, pp.263–68, listed at [1] below, two circuits can be compared by means of binary decision diagrams (BDDs). In particular, this is aimed at highly complex digital circuits which are intended to be compared with one another, and for which structural similarities are determined (combinatorial circuit verification).

A first approach for combinatorial circuit verification attempts to produce functional implications by generating test patterns which are applied to the circuits to be compared (ATPG method). In this case, the object is to prove that an exclusive-or function between two output values to be compared cannot result in a logic "1".

Another approach for combinatorial circuit verification is based on a canonic description of Boolean functions. Such a canonic description is represented by BDDs or specific variants of BDDs, for example by Reduced Ordered BDDs (ROBDDs). In this context, see [2] Jain, et al., "A Survey of Techniques for Formal Verification of Combinatorial Circuits", Proc. Int. Conf. on Computer Design (ICCD), 1997, pp.445–54, listed at [2] below. One special problem of BDDs is that of their exponentially rising memory space requirement.

What is referred to as an SAT comparison method (also SAT comparator; SAT="Satisfiability") is known from J. P. M. Silva: "An Overview of Backtrack Search Satisfiability Algorithms,", 5th Int. Symposium on Artificial Intelligence and Mathematics, 1998, listed at [3] below; Bayardo, Jr. and Schrag, "Using CSP Look-Back Techniques to Solve Real-World SAT-Instances", Proc. of the National Conf. on Artificial Intelligence, pp.203–08, July 1997, listed at [4] below; and Davis and Putnam: "A Computing Procedure for Quantification Theory", Journal of the Association for Computing Machinery, Vol. 7, Number 3, July 1960, pp.125–39, listed at [7] below. The SAT comparison method is distinguished by searching systematically for solutions for any given Boolean notations in the form $$(k_1 \vee k_2) \wedge (k_3 \vee \overline{k_5}) \wedge (k_2 \vee \overline{k_4}) \quad (1)$$

If the entire search area is exhausted without any solution being found during the search, then the fundamental Boolean problem cannot be solved.

SUMMARY OF THE INVENTION

The object of the present invention is to provide a method and a device for comparing a first characteristic with a predetermined characteristics of a technical system which overcomes the above-noted deficiencies and disadvantages of the prior art devices and methods of this general kind, and which ensures automatic solution of the comparison problem.

With the above and other objects in view there is provided, in accordance with the invention, a method of comparing a first characteristic with predetermined characteristics of a technical system, which comprises:

defining at least two comparison methods, each capable of carrying out a comparison of a Boolean function of the first characteristic with Boolean functions of the predetermined characteristics of the technical system; and processing the at least two comparison methods in a predetermined sequence until a result of the comparison is defined.

In order to achieve the object, a method is specified for comparison of a first characteristic with predetermined characteristics of a technical system, in which at least two comparison methods are provided, each of which can carry out a comparison of the first characteristic with the predetermined characteristics of the technical system. The at least two comparison methods are processed in a predetermined sequence until a result of the comparison is defined.

In this case, it is particularly advantageous for different comparison methods to be processed automatically.

One development is for the result of the comparison to be equality of or a difference between the first characteristic and the characteristics of the technical system.

In particular, the comparison process can be terminated as soon as a single difference is discovered.

Another development provides for the first characteristic to be verified by the technical system on the basis of equality.

The at least two comparison methods may, in particular, be two of the following comparison methods:

a) SAT comparison method;

b) simulation method;

c) BDD method;

d) ATPG method;

e) methods based on internal equivalence points.

In particular, the BDD method may be an ROBDD method. Furthermore, the ROBDD method may be carried out with respect to its leaves or with respect to the sectional planes.

The technical system may be a circuit, in particular a digital electrical circuit.

In accordance with an added feature of the invention, at least a portion of the comparison is carried out with an intermediate result reducing the complexity of the overall comparison process. Reducing the complexity in this way allows a result to be achieved by means of a comparison method which originally failed in the overall comparison process.

In accordance with an additional feature of the invention, the intermediate result of a comparison method which was not carried out to the end, is used in a further comparison method (utilization of side effects). For example, a terminated BDD comparison method offers an approach for representing the problem to be solved (in this case, the overall comparison). This is done using a different comparison method as the intermediate result, which results in computation time and/or memory space being saved.

If a comparison results in inequality, then diagnosis information is preferably represented, allowing a user to determine the cause of the inequality.

In the course of one development, the technical system is described as a finite automatically controlled device. Furthermore, the first characteristic may be represented as a Boolean function. In addition, the first characteristic can describe a behavior of the technical system over a predetermined time interval.

Digital circuits are becoming increasingly larger. Any test for correct behavior is thus becoming more complex, more time-consuming, and more expensive. MC for circuits of an actual size is thus a critical economic factor. The convenience of the technique for the user is considerably simplified by the method described above and the associated configuration. The approach described here is not limited to hardware design, but can also be used for verification of software, whose behavior can preferably be described by a finite automatically controlled device (for example SDL programs, protocols).

In the present approach, a hybrid verification process, that is to say a process using a number of comparison methods, can be used to solve a verification task. A hybrid verification process is a framework which contains a set of partial verification processes (individual comparison methods). The hybrid verification process coordinates the way in which the partial verification processes operate. The aim is to use different verification processes to solve verification tasks which no verification process would have solved on its own. If none of the partial verification processes can solve a given verification task, then this verification task is broken down. To do this, subtasks are transferred to each partial verification process, which the latter can process subject to allocation of resources. If a threshold value for the allocation of associated resources is exceeded, the verification process terminates its processing. The hybrid verification process then decides whether the subtask will be handled by another partial verification process, whether the resources should be increased or whether to continue with a different subtask.

In the course of an additional refinement, a threshold value for resources to be provided (for example memory space or computation power) and/or time to be provided for carrying out the comparison method are/is defined for each comparison method, with the respective comparison method being ended as being unsuccessful if the threshold value is succeeded.

This is particularly advantageous when a single comparison method blocks a computer on which it is running, or no solution is defined in a predetermined time interval, for example due to rapidly rising complexity. In a case such as this, it is often better to work out a solution using the next comparison method.

Another development is for the sequence of the comparison methods to be carried out to be adapted dynamically. This is preferably done by also recording which comparison method has defined the most results, with this "best" comparison method being used first of all for future comparisons. The sequence is accordingly sorted with the "second-best", the "third-best" etc. comparison methods.

The result of the comparison can be used to design, to adapt or to control the technical system.

Particular in the case of the circuit simulation, the result of the described comparison can be implemented directly, if it is positive, by a predetermined description form initiating a production process for the circuit.

With the above and other objects in view there is also provided, in accordance with the invention, a configuration for comparing a first characteristic with predetermined characteristics of a technical system, comprising a processor unit configured with at least two comparison methods, each comparison method allowing a Boolean function of the first characteristic to be compared with Boolean functions of the predetermined characteristics of the technical system; and to process the at least two comparison methods in a predetermined sequence until a result of the comparison can be defined.

In other words, the processor unit is set up in such a manner that a) at least two comparison methods are provided, each of which allows the first characteristic to be compared with the predetermined characteristics of the technical system;

b) the at least two comparison methods are processed in a predetermined sequence until a result of the comparison can be defined.

The configuration according to the invention is particularly suitable for carrying out the above-outlined method, or one of its developments.

Other features which are considered as characteristic for the invention are set forth in the appended claims.

Although the invention is illustrated and described herein as embodied in a method and configuration for comparison of a first characteristic with predetermined characteristics of a technical system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Before specifically describing the drawing figures in detail, a few general comments will be provided so as to define the terminology and standard procedures referenced herein. One procedure for model checking (MC) is, in particular, as follows:

the technical system is represented as a finite automatically controlled device;

one characteristic describes the behavior of the technical system over a finite time interval;

that characteristic is represented as a Boolean function;

the verification task is reduced to verification of the equality of Boolean functions;

the equality of two Boolean functions is established using a hybrid comparator.

Characteristics

Characteristics describe the behavior of a technical system over a predetermined finite number of points in time (=invariant over a finite time interval).

Based on a set of atomic statements (AA), one possible characteristic language is defined. An elementary statement (EA) (state expression) is any given Boolean term of AA.

In the following, t is any given fixed point in time. Characteristics are formulated with reference to this point in time.

An elementary statement relating to the point in time t+k ($EA^k$) (time state expression; k is an integer greater than or equal to 0) is an expression in the form $$\text{at } t+:EA \quad (2).$$

A characteristic (over n points in time) is a Boolean term of a finite number of timed elementary statements $$EA^k \text{ where } k<n \quad (3).$$

In order to structure characteristics (better), they can be subdivided into an assumption part (assume) and a verification part (prove); this is equivalent to the implication $$\text{assume} => \text{prove} \quad (4).$$

Example of a characteristic:

assume: at t+0: not reset and at t+1: not reset;

prove: at t+0: request implies at t+1: acknowledge.

In this case, "reset", "request", "acknowledge" are atomic statements. The characteristic expresses the fact that, subject to the precondition "not reset", a "request" (relating to the point in time 0) is acknowledged with an "acknowledge" after one step in time.

Semantics

The following test considers, in particular, technical systems which can be represented as finite, automatically controlled devices. Systems such as these are, for example, circuits (in the form of VHDL programs or EDIF network lists). A finite, deterministic automatically controlled device is a 5-tuple in the form $$(S, I, T, MAA, P) \quad (5),$$

where

S is a finite set of states,

I is a finite set of input signals, $T \subseteq S \times I \times S$ is a transitional relationship, MAA is a set of atomic statements (AA) and P: $S \times I \to$ power set (MAA) is an assessment function.

The assessment function P indicates which atomic statements (AA) are satisfied in one state.

A characteristic function $\chi_E$ is agreed for a characteristic E. The characteristic function $\chi_E$ is used to define the validity of the characteristic E.

It is assumed that AA is an atomic statement and $B=\{0.1\}$ is the Boolean set. The characteristic function $\chi_E$ is defined by $$\chi_{AA}:S \times I \to B \quad (6)$$

where $\chi_{AA}(s, i)=1$ when, and only when AA $\in$ P(s, i), that is to say AA is satisfied in (s, i). Furthermore, $$EA=B(AA_1, \ldots, AA_m) \quad (7)$$

is assumed to be a Boolean term of atomic statements (that is to say an elementary statement). The following statement is thus defined:

$$\chi_{EA}=B(\chi_{AA_1}, \ldots, \chi_{AA_m}) \quad (8)$$

In the following text, statements are considered which relate to a number of states. It is assumed that $$\sigma=((s_0,i_o), \ldots, (s_{n-1},i_{n-1})) \in (S \times I)^n \quad (9)$$

and $$\sigma^k=(s_k,i_k) \quad (10)$$

and that E is a characteristic over n points in time. The characteristic function $\chi_E$ is a function $$\chi_E:(S \times I)^n \to B \quad (11)$$

where $$\chi_E(\sigma)=\chi_{EA}(\sigma^k) \quad (12),$$

if $$E=EA^k \quad (13)$$

is an elementary statement, and $$\chi_E(\sigma)=B(\chi_{EA_1}k_1(\sigma), \ldots, \chi_{EA_m}k_m(\sigma)) \quad (14),$$

if $$E=B(EA_1^{k_1}, \ldots, EA_m^{k_m}) \quad (15)$$

is a Boolean term of elementary statements.

Characteristics (over n points in time) are interpreted via paths (of length n) of an automatically controlled device.

$$\chi_T:S \times I \times S \to B \quad (16)$$

is assumed to be the characteristic function of the transitional relationship T. $\sigma$ is a path of length n when $s_{k+1}$ is a subsequent state of $S_k$, that is to say when:

$$(s_k,i_k,s_{k+1}) \in T \quad (17)$$

or $$\chi_T(s_k,i_k,s_{k+1})=1 \text{ for } k=0,1,\ldots,n-2(n \geq 2) \quad (18).$$

It follows from this that:

$$\chi_{path}(\sigma)=\chi_T(s_0,i_o,s_1) \wedge \cdots \wedge \chi_T(s_{n-2},i_{n-2},s_{n-1}) \quad (19).$$

A characteristic E over n points in time is then satisfied precisely when:

$$(\chi_{path}=>\chi_E)(\sigma)=1 \quad (20)$$

for all paths $\sigma$ of length n.

An opposite example relating to the characteristic E is an assignment $\sigma_0$, so that $$(\chi_{path} \wedge \text{not } \chi_E)(\sigma_0) = 1 \quad (21).$$

The methods described below can be applied to any desired functions in accordance with equation (11). The described characteristic language represents only one possible instance for describing characteristics. It would likewise be possible to expand the definition area $(S \times I)^n$, for example to $(S \times I)^n \times S$, in order to define a more powerful language.

The following text is based on the assumption of binary coding of the finite automatically controlled device, that is to say $$S = B^u, I = B^v \text{ for } u, v \geq 0 \quad (22).$$

The verification is thus based on verification that a Boolean function is equal to the constant function 1.

This Leads to the Special Case of a Combinatorial Comparison

In the case of combinatorial comparison, two finite, deterministic automatically controlled devices with an output are compared with one another. These automatically controlled devices may represent, for example, two digital circuits. A finite, deterministic automatically controlled device with an output is a 5-tuple $$(S, I, O, \delta, \lambda) \quad (23)$$

where

S is a finite set of states,
I is a finite set of input symbols,
O is a finite set of output symbols,
$\delta: S \times I \to S$ is the transitional function,
$\lambda: S \times I \to O$ is the output function.

Let $$M_i = (S_i, I_i, O_i, \delta_i, \lambda_i) \text{ where } i = 1, 2 \quad (24)$$

be two finite, deterministic automatically controlled devices with an output. The expression common coding of $M_1$, $M_2$ means bijective maps $$b_{ij_S}: S_1 \to S_2, \, b_{ij_I}: I_1 \to I_2, \, b_{ij_O}: O_1 \to O_2 \quad (25)$$

where '$b_{ij}$' is a bijection.

The automatically controlled devices are referred to as being combinatorially equivalent with respect to common coding in accordance with equation (25) when, and only when:

$$b_{ij_S}(\delta_1(s,i)) = \delta_2(b_{ij_S}(s), b_{ij_I}(i)) \quad (26)$$

and $$b_{ij_O}(\lambda_1(s,i)) = \lambda_2(b_{ij_S}(s), b_{ij_I}(i)) \quad (27)$$

for all $s \in S_1$, $i \in I_1$. After identification of $$S_1 = S_2 = S, \, I_1 = I_2 = I, \, O_1 = O_2 = O \quad (28)$$

this results in the conditions $$\delta_1(s,i) = \delta_2(s,i) \quad (29).$$

and $$\lambda_1(s,i) = \lambda_2(s,i) \quad (30)$$

for all $s \in S_1$ and $i \in I_1$.

Binary coding of S, I, O changes this to a (finite) number of equality relationships between Boolean functions.

Verification Process $$F_{1j}, F_{2j}, j = 1, 2, \ldots, n \quad (31)$$

are assumed to be Boolean functions. There are various methods (comparison methods) for dealing with the problem $$\text{"Is } F_{1j} = F_{2j} \text{ for } j = 1, 2, \ldots, n?\text{"} \quad (32)$$

In this case, each method has its own strengths and weaknesses. The weaknesses of individual methods are eliminated, and hence the robustness of the solution approach is increased considerably, by using a suitable selection of such methods. Overlapping use of the methods allows considerably larger systems to be compared that would be feasible with in each case one individual method.

In a first step, the functions in equation (31) are represented by a directional acyclic graph. The individual methods, also referred to as partial verification processes, are plotted on this graph structure.

A directional, acyclic graph is a set K of nodes and a set ($\subseteq K \times K$) of directional links, which each connect two nodes to one another. The graph does not include any cycles. A node $k_2$ is referred to as the son of the node $k_1$ if a directional link connects the node $k_1$ to the node $k_2$. Leaves are nodes from which no links originate. Roots are nodes to which no links lead. Directional links run from top to bottom, so that roots are right at the top, and leaves right at the bottom on the graph.

The expression base of graph (also: sectional plane) refers to a subset of nodes with the characteristic "each path from a root to a leaf runs through a node of the base". In particular, the set of all leaves forms a base. Reference is had, in this context, to Y. Matsunaga: "An Efficient Equivalence Checker for Combinatorial Circuits", $33^{rd}$ ACM/IEEE Design Automation Conference, 1996, pp.629–34, listed below at [5]. Matsunaga describes an algorithm with which a base can be defined.

It is assumed that k is a node in the graph structure G. What is referred to as the cone of influence of k is the smallest substructure $G_k$ of G for which it can be said that: the node k is associated with $G_k$ and, with a node k', all the sons of k' are also associated with $G_k$.

With the following interpretation, a directional, acyclic graph represents a Boolean function: a Boolean operation $op_k$ is associated with each node k which differs from a leaf. The sons of the node k are the operands of $op_k$. Leaves (roots) represent the argument (the value) of the Boolean function. A leaf may also be a constant with a value of "0" or a value of "1". Each node in the graph structure G represents a Boolean function $boole_k$, which is dependent on the primary inputs. The representation of a Boolean function as a graph is not canonic, that is to say there are in general a large number of different representations. Nodes which represent the same Boolean function are referred to as being equivalent.

In order to obtain a compact representation, links may be marked in order to symbolize single-digit operations, for example not. For example, Kühlmann and Krom, listed at [1], allow only a two-digit and-operation in the nodes. The (single-digit) not-operation is annotated by marking the link.

When constructing the graph, a hash table is used to ensure the unambiguity of a node. After each change to the graph (that is to say joining of two or more different, equivalent nodes), identical nodes which occur more than once are joined together; the unambiguity of a node is thus maintained. This process is referred to as rehashing.

One object of the verification process is to simplify the fundamental graph until the problem (32) can be solved:

In various phases of the method, nodes are defined which represent the same function, that is to say which are equivalent. Among these nodes, one node is then selected as being representative, and all the other nodes are replaced by this representative. This process is referred to as elimination of redundant nodes. Rehashing is always carried out immediately after elimination.

At the start of each verification step, in order to verify, for example, an equality $$\text{boole}_{k_1} = \text{boole}_{k_2} \tag{33}$$

for two different nodes $k_1, k_2$, the cone of influence of the nodes involved is first of all defined, and the calculation process is then continued on this cone of influence.

The following text describes one possible choice of methods/verification processes which are used in one implementation. These are:

complete simulation;
ROBDD method (with regard to leaves);
ROBDD method (with regard to sectional planes);
ATPG method (automatic test pattern generation);
SAT method (Boolean satisfiability algorithms);
Verification process for internal equivalence points.

The individual verification processes/methods will be described in detail in the following text.

Simulation

The simulation (see Krohm, Kühlmann, and Mets: "The Use of Random Simulation in Formal Verification", Proc. Int. Conf. on Computer Design (ICCD), 1996, pp.371–76, listed at [6]) is carried out from the leaves to the roots: each leaf is first of all assigned a value "0" or "1". Once a value has been assigned to each son of a node k, the value of the node k is defined by means of the operation $op_k$.

ROBDDs

Reduced Ordered Binary Decision Diagrams (ROBDDS) (see Jain, et al.: "A Survey of Techniques for Formal Verification of Combinatorial Circuits", Proc. Int. Conf. on Computer Design (ICCD), 1997, pp.445–54, listed at [2]) represent a Boolean function as an acyclic graph. This representation is unique for a given permutation of the arguments, the variable order. In many cases, the variable order is critical to the size of the graph. If it is possible to represent the Boolean function as an ROBDD (taking account of existing restrictions on memory and delay time), then the question of the equality of different technical systems is solved directly on the basis of the unambiguity of the representation. The success of this method depends on the Boolean function and on the chosen variable order.

The calculation of an ROBDD for the roots of a graph G starts from a base (sectional plane) of the graph G, and continues in the direction of the roots. First of all, each base node is assigned a BDD variable. This is important since, in particular, the variable order is defined by this assignment. Once the ROBDDs have been calculated for all the sons of a node k, the ROBDD of the node k can also be produced. If the size of an ROBDD exceeds a predetermined limit, the ROBDD generation is terminated. (In Kühlmann and Krohm, at [1], the node is assigned a new variable, and calculation continues.) ROBDD is the main representative from a number of similar representations of Boolean functions (see in particular Jain, et al., at [2]). Each of the representations mentioned there can be used here.

A Hybrid Verification Process

In order to allow a decision on the statement (32), the Boolean functions (31) are represented by a directional, acyclic graph G. For each function $F_{ij}$, there is a node $k_{ij}$ in the graph G, which represents $F_{ij}$. The equations $F_{1j} \equiv F_{2j}$ are now sorted with respect to the distance between the corresponding node pair $(k_{1j}, k_{2j})$ and the leaves on the graph G. The hybrid verification process is called successively for each node pair $(k_{1j}, k_{2j})$, starting with node pairs close to the leaves.

Figure 1:
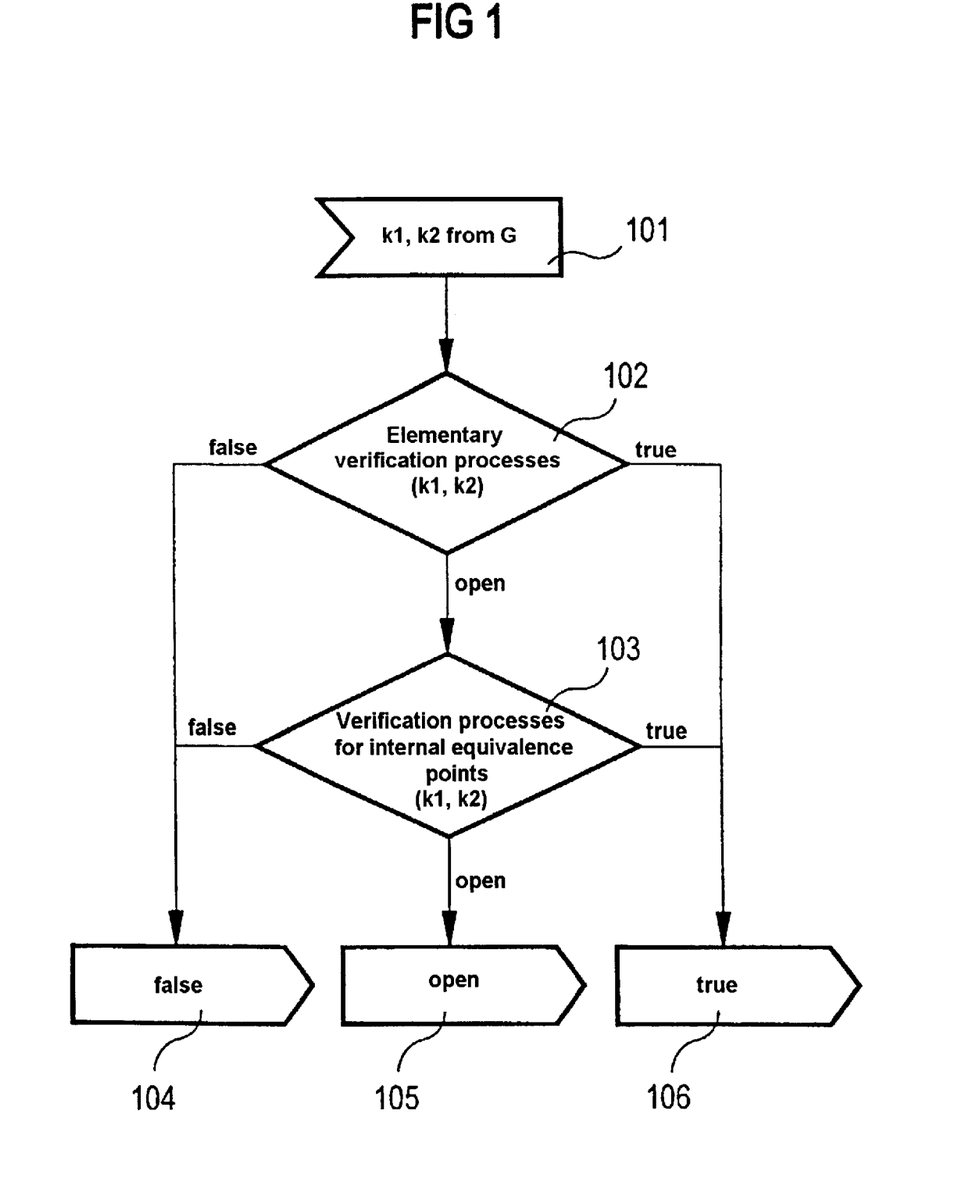
FIG. 1 is a block diagram of the method of operation of a hybrid verification process.

FIG. 1 shows a hybrid verification process. Two nodes $k_1$, $k_2$ on the graph G (see block 1 in FIG. 1) are used as an input to the verification process. The aim is to decide whether the functions $\text{boole}_{k_1}$, $\text{boole}_{k_2}$ represented by the nodes $k_1$, $k_2$ are identical, that is to say whether $$\text{boole}_{k_1} = \text{boole}_{k_2} \tag{34}.$$

The graph G represents a global data structure, which each partial verification process (elementary verification process, see block 102 and FIG. 2) can access.

Figure 2:
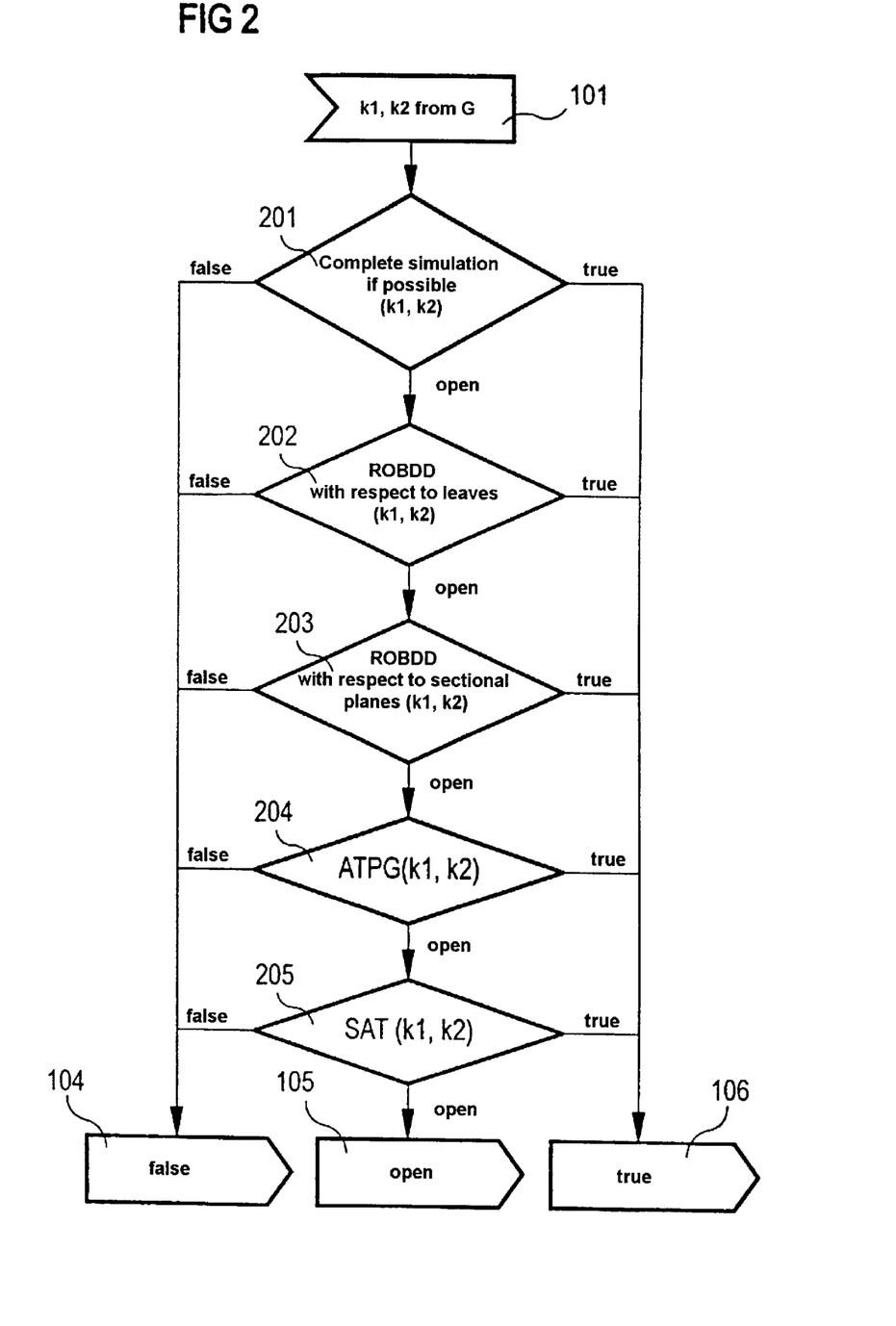
FIG. 2 is a block diagram of the selection of elementary verification processes and parts of a hybrid verification process.

The partial verification processes attempt to simplify the graph G step-by-step by joining equivalent nodes together such that, in the end, the equation (34) can be verified or disproved, for example by means of complete simulation.

In the following text, $COI(k_1,k_2)$ refers to the cone of influence of $k_1$, $k_2$ in the graph G.

If the partial verification processes, subsumed in block 102 in FIG. 1, do not lead to success, then a verification method for internal equivalence points (see also FIG. 3) is carried out in a block 103. Each individual verification process can provide the results "FALSE" 104, that is to say the technical systems to be compared differ, "TRUE" 106, if the systems are identical, or "OPEN" 105 if the verification process has not been able to come to a conclusion.

Individual steps involved in carrying out the hybrid verification process are described and explained in the following text.

Figure 4:
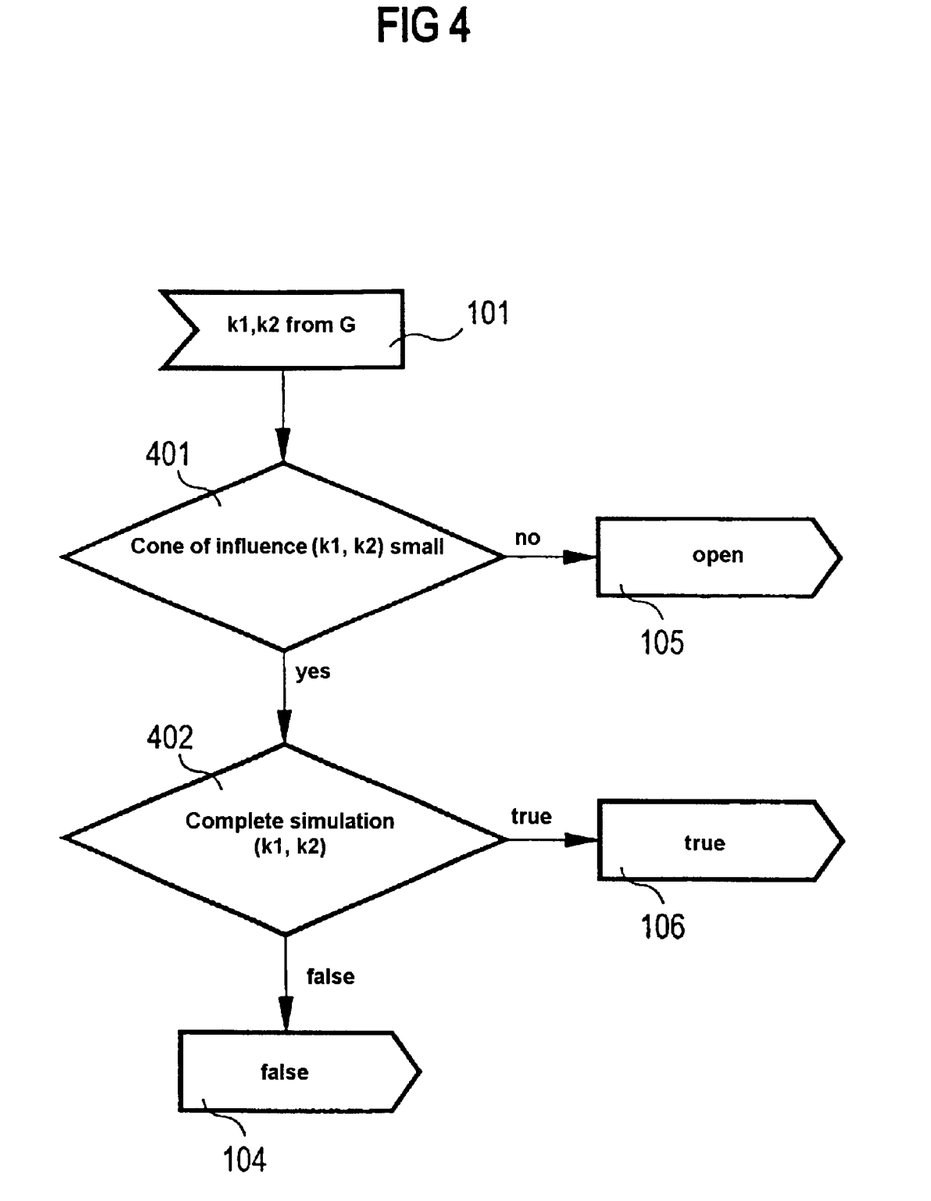
FIG. 4 is a block diagram which illustrates how a complete simulation is carried out.

Step 1: Complete simulation, see FIG. 2, block 201 and FIG. 4:

For 'small' $COI(k_1,k_2)$ (see block 401): all possible value assignments are simulated, and a test is then carried out to determine whether or not they satisfy the equation (34) (see block 402).

Step 2: ROBDDs relating to leaves, see block 202:

Choose as a base the set of all the leaves of $COI(k_1,k_2)$. Calculate ROBDDs on $COI(k_1,k_2)$ up to a predetermined size. If there are any redundant nodes in $COI(k_1,k_2)$, that is to say nodes where the same ROBDD representation occur, these redundant nodes are eliminated, and step 2 is repeated.

Figure 5:
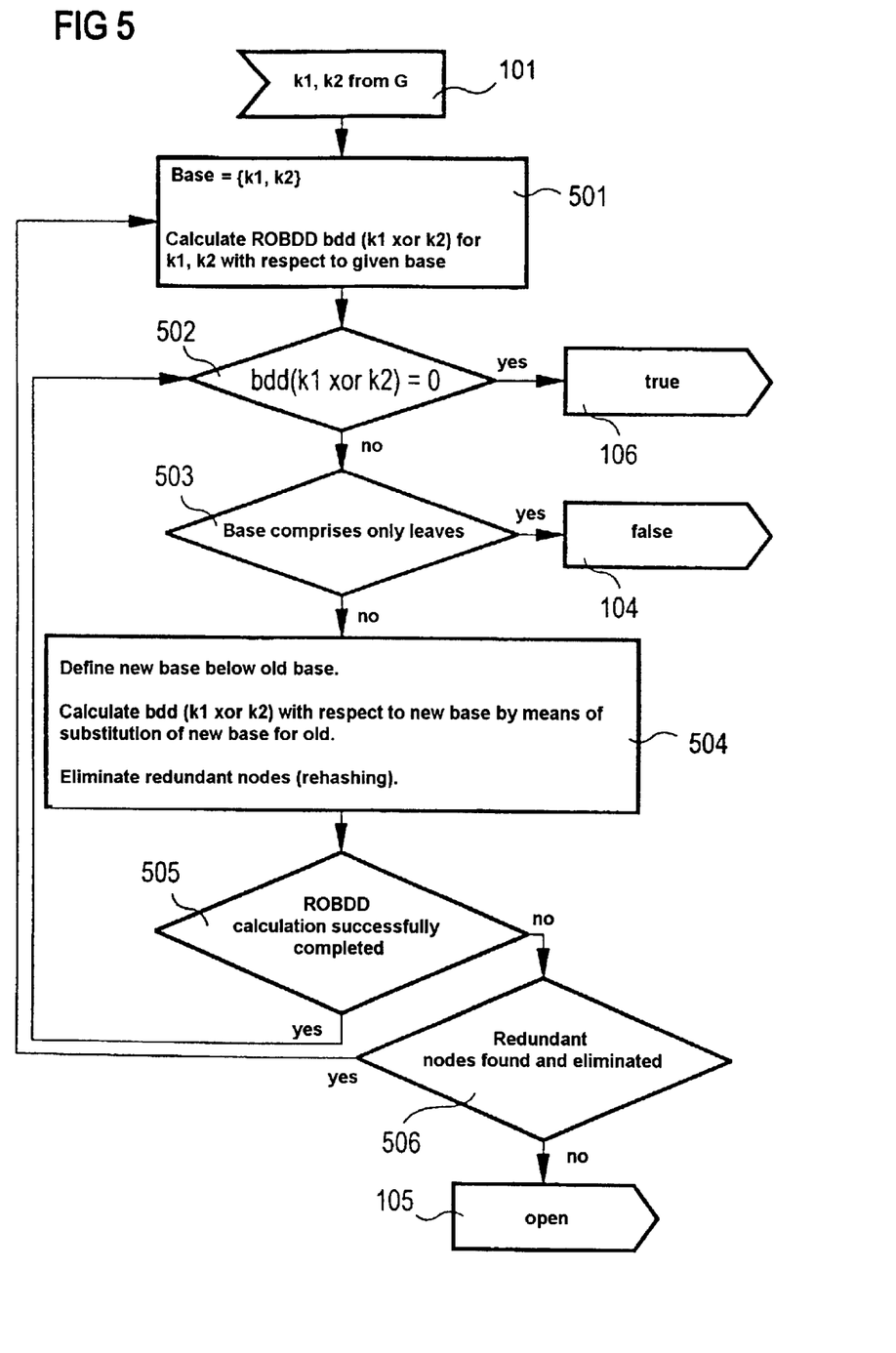
FIG. 5 is a block diagram with steps in a ROBDD verification method.

Step 3: ROBDDs relating to sectional planes, see block 203 and FIG. 5:

Choose as a base a set of nodes 'close' to the roots $k_1$, $k_2$ (see Matsunaga, at [5]). Calculate ROBDDs on $COI(k_1,k_2)$ up to a predetermined size (see block 501). If redundant nodes occur in $COI(k_1,k_2)$, that is to say nodes with the same ROBDD representation, these redundant nodes are eliminated (see block 502).

If the chosen base does not consist solely of leaves (see block 503), any disproof which is found may be false, because the base nodes may be dependent on one another (false negative).

Step 3 is repeated by moving the base in the direction of the leaves (see block 504).

Step 3 is ended only when the calculation of the ROBDDs becomes too large, equation (34) is verified or the base consists entirely of leaves (see blocks 505 and 506).

Step 4: ATPG, see block 204:

The question as to whether a Boolean function assumes the value "0" or "1" and the question relating to the equality of two Boolean functions can be formulated as a problem in the field of automatic test pattern generation (ATPG).

Step 5: SAT, see block 205:

The statement (34) is changed to a conjunctive normal form, and is transferred to an SAT verification process. Reference is had, in this context, to J. P. M. Silva.: "An Overview of Backtrack Search Satisfiability Algorithms", $5^{th}$ Int. Symposium on Artificial Intelligence and Mathematics, 1998, listed at [3] below; and Bayardo, Jr. and Schrag, listed at [4]).

Figure 3:
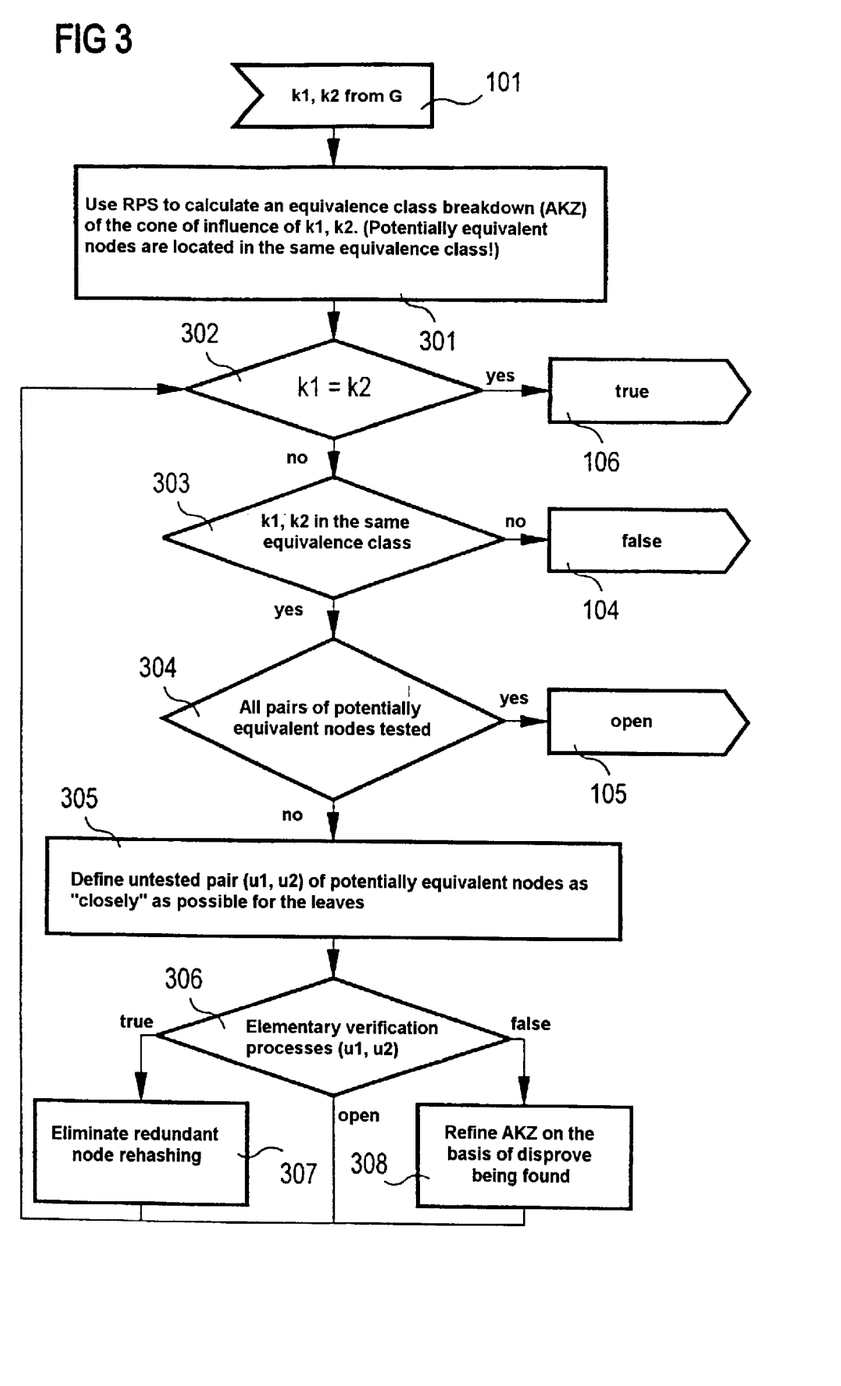
FIG. 3 is a block diagram of a verification process for internal equivalence points.

Step 6: Verification process for internal equivalent points, see block 103 and FIG. 3:

Step 6.1: (RPS—Random Pattern Simulation):

The nodes of the graph structure G are broken down into equivalence classes (see block 301):

Based on a breakdown {K}, an existing breakdown is refined by means of a simulation step. In this case, a class AK is broken down into two subclasses $AK_0, AK_1$, with $AK_i$ representing the set of all nodes ∈ AK to which the value i is assigned by the simulation. The simulation uses a random number generator for allocating values to the leaves (Random Pattern Simulation=RPS). This refinement step is carried out a number of times.

An equivalence class represents a set of nodes which potentially represent the same function. Nodes from different equivalence classes cannot represent the same function.

Step 6.2:

All the potentially equivalent node pairs are successively investigated for actual equivalence, that is to say they are checked to determine whether they represent the same Boolean function (see blocks 302, 303 and 304).

That node pair $(u_1, u_2)$ which has not yet been dealt with but is potentially equivalent is in each case defined which is 'closest' to the leaves (see block 305). Steps 1–5 are carried out for this node pair $(u_1, u_2)$ (see block 306). This will give one of three results:

a. the node pair $(u_1, u_2)$ is actually equivalent: one node is redundant and can be eliminated (see block 307);

b. the node pair $(u_1, u_2)$ is not equivalent: an allocation of variables (leaves in the cone of influence of $u_1, u_2$) has been found for which the two functions $boole_{u_1}$ and $boole_{u_2}$ differ. After assigning random values to the other leaves on the graph G, the graph G is simulated, and the previous equivalence class breakdown is refined. This reduces the number of potential equivalent node pairs (see block 308);

c. the equivalence verification cannot be decided owing to complexity limits: the next node pair is checked.

After each check, a potentially equivalent node pair is tested to determine whether the original node pair $(k_1, k_2)$ is equivalent. If this is not the case, the node pair $(k_1, k_2)$ is tested in the last step.

Figure 6:
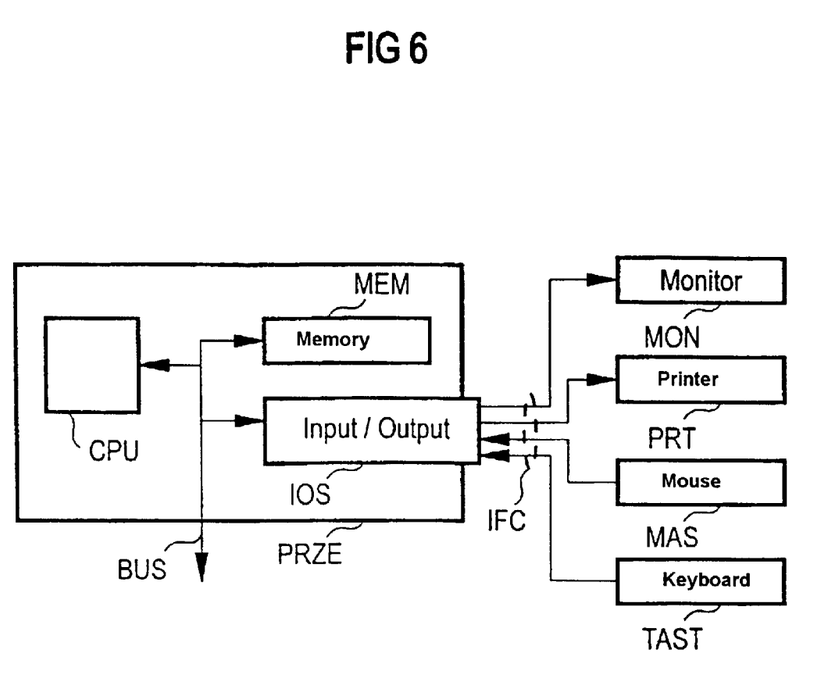
FIG. 6 is a block diagram of a processor unit.

FIG. 6 shows a processor unit PRZE. The processor unit PRZE comprises a processor CPU, a memory MEM and an input/output interface IOS, which is used in various ways via an interface IFC: a graphics interface allows an output to be viewed on a monitor MON and/or to be output on a printer PRT. An input is made via a mouse MAS or a keyboard TAST. The processor unit PRZE also has a data bus BUS, which ensures the connection from the memory MEM, the processor CPU and the input/output interface IOS. Furthermore, additional components can be connected to the data bus BUS, for example additional memory, a data memory (hard disk) or a scanner.

The following is a list of references mentioned in the foregoing description. The disclosures of these documents are herewith incorporated by reference:

[1] A. Kühlmann, F. Krohm: "Equivalence Checking Using Cuts and Heaps", $34^{th}$ ACM/IEEE Design Automation Conference, 1997, pp.263–68.

[2] J. Jain, N. Narayan, M. Fujita, A. Sangiovanni-Vincentelli: "A Survey of Techniques for Formal Verification of Combinatorial Circuits", Proc. Int. Conf. on Computer Design (ICCD), 1997, pp.445–54.

[3] J. P. M. Silva: "An Overview of Backtrack Search Satisfiability Algorithms", $5^{th}$ Int. Symposium on Artificial Intelligence and Mathematics, 1998.

[4] R. J. Bayardo Jr., R. C. Schrag: "Using CSP Look-Back Techniques to Solve Real-World SAT-Instances", Proc. of the National Conf. on Artificial Intelligence, pp.203–208, July 1997.

[5] Y. Matsunaga: "An Efficient Equivalence Checker for Combinatorial Circuits", $33^{rd}$ ACM/IEEE Design Automation Conference, 1996, pp.629–34.

[6] F. Krohm, A. Kühlmann, A. Mets: "The Use of Random Simulation in Formal Verification", Proc. Int. Conf. on Computer Design (ICCD), 1996, pp.371–76.

[7] M. Davis, H. Putnam: "A Computing Procedure for Quantification Theory", Journal of the Association for Computing Machinery, Vol. 7, Number 3, July 1960, pp.125–39.

We claim:

1. A method of comparing a first characteristic with predetermined characteristics of a technical system, which comprises:

defining at least two comparison methods, each capable of carrying out a comparison of a Boolean function of the first characteristic with Boolean functions of the predetermined characteristics of the technical system;

processing the at least two comparison methods in a predetermined sequence until a result of the comparison is defined; and selecting the predetermined characteristics of the technical system from the group consisting of a state/next state behavior and an output behavior of the technical system.

2. The method according to claim 1, which comprises defining the result of the comparison as one of equality of and a difference between the first characteristic and the predetermined characteristics of the technical system.

3. The method according to claim 2, which comprises verifying the first characteristic by the technical system on the basis of the equality.

4. The method according to claim 1, which comprises selecting the at least two comparison methods from the group of comparison methods consisting of:

SAT comparison method;

simulation method;

BDD method;

ATPG method; and methods based on internal equivalence points.

5. The method according to claim 4, wherein the BDD method is an ROBDD method.

6. The method according to claim 5, which comprises carrying out the ROBDD method with respect to leaves or with respect to sectional planes in a graph representing the Boolean functions.

7. The method according to claim 1, which comprises defining a circuit as the technical system.

8. The method according to claim 1, which comprises defining an electrical circuit as the technical system.

9. The method according to claim 1, which comprises defining a finite automatically controlled device as the technical system.

10. The method according to claim 1, wherein the first characteristic describes a behavior of the technical system over a predetermined time interval.

11. The method according to claim 1, which comprises defining a threshold value with respect to one of resources to be provided and time to be afforded for processing each comparison method, and terminating the respective comparison method as being unsuccessful if the threshold value is exceeded.

12. A method of comparing first characteristic with predetermined characteristics of a technical system, which comprises:
defining at least two comparison methods, each capable of carrying out a comparison of a Boolean function of the first characteristic with Boolean functions of the predetermined characteristics of the technical system;
adapting a sequence of the comparison methods to be carried out;
processing the at least two comparison methods in the adapted sequence until a result of the comparison is defined; and
calling first the comparison method that has been able to solve most comparisons.

13. The method according to claim 1, which comprises adapting or controlling at least one technical system based on the result of the comparison.

14. The method according to claim 1, which comprises simplifying the comparison by way of side effects from comparison methods already having been called.

15. A configuration for comparing a first characteristic with predetermined characteristics of a technical system, comprising a processor unit configured:
with at least two comparison methods, each comparison method allowing a Boolean function of the first characteristic to be compared with Boolean functions of the predetermined characteristics of the technical system;
to process the at least two comparison methods in a predetermined sequence until a result of the comparison can be defined; and
to select the predetermined characteristics of the technical system from the group consisting of a State/next state behavior and an output behavior of the technical system.

16. The method according to claim 1, which comprises eliminating from the predetermined characteristics of the technical system all multi-step and multi-path behavior.

17. The method according to claim 1, wherein the first characteristic is an intended characteristic of the technical system which cannot be directly compared with one of the predetermined characteristics of the technical system.

18. The method according to claim 17, wherein the intended characteristic cannot be directly compared with characteristics describing a behavior over a path length of greater than one.

19. The method according to claim 12, which comprises defining the result of the comparison as one of equality of and a difference between the first characteristic and the predetermined characteristics of the technical system.

20. The method according to claim 19, which comprises verifying the first characteristic by the technical system on the basis of the equality.

21. The method according to claim 12, which comprises selecting the at least two comparison methods from the group of comparison methods consisting of:
SAT comparison method;
simulation method;
BDD method;
ATPG method; and
methods based on internal equivalence points.

22. The method according to claim 21, wherein the BDD method is an ROBDD method.

23. The method according to claim 22, which comprises carrying out the ROBDD method with respect to leaves or with respect to sectional planes in a graph representing the Boolean functions.

24. The method according to claim 12, which comprises defining a circuit as the technical system.

25. The method according to claim 12, which comprises defining an electrical circuit as the technical system.

26. The method according to claim 12, which comprises defining a finite automatically controlled device as the technical system.

27. The method according to claim 12, wherein the first characteristic describes a behavior of the technical system over a predetermined time interval.

28. The method according to claim 12, which comprises defining a threshold value with respect to one of resources to be provided and time to be afforded for processing each comparison method, and terminating the respective comparison method as being unsuccessful if the threshold value is exceeded.

29. The method according to claim 12, which comprises adapting or controlling at least one technical system based on the result of the comparison.

30. The method according to claim 12, which comprises simplifying the comparison by way of side effects from comparison methods already having been called.

31. The method according to claim 12, which comprises selecting the predetermined characteristics of the technical system from the group consisting of a state/next state behavior and an output behavior of the technical system.

32. The method according to claim which comprises eliminating from the predetermined characteristics of the technical system all multi-step and multi-path behavior.

33. The method according to claim 12, wherein the first characteristic is an intended characteristic of the technical system which cannot be directly compared with one of the predetermined characteristics of the technical system.

34. The method according to claim 33, wherein the intended characteristic cannot be directly compared with characteristics describing a behavior over a path length of greater than one.

35. A configuration for comparing a first characteristic with predetermined characteristics of a technical system, comprising a processor unit configured:
with at least two comparison methods, each comparison method allowing a Boolean function of the first characteristic to be compared with Boolean functions of the predetermined characteristics of the technical system;
to adapt a sequence of the comparison methods to be carried out;
to process the at least two comparison methods in the adapted sequence until a result of the comparison can be defined; and
to call first the comparison method that has been able to solve most comparisons.

* * * * *